(12) United States Patent
Lorenz

(10) Patent No.: US 8,237,467 B2
(45) Date of Patent: Aug. 7, 2012

(54) RESISTOR-PROGRAMMABLE DEVICE AT LOW VOLTAGE

(75) Inventor: Perry Scott Lorenz, Fort Collins, CO (US)

(73) Assignee: National Semiconductor Corporation, Santa Clara, CA (US)

( * ) Notice: Subject to any disclaimer, the term of this patent is extended or adjusted under 35 U.S.C. 154(b) by 118 days.

(21) Appl. No.: 12/803,368

(22) Filed: Jun. 25, 2010

(65) Prior Publication Data

US 2011/0316588 A1    Dec. 29, 2011

(51) Int. Cl.
*H03K 19/0175* (2006.01)

(52) U.S. Cl. .............. 326/82; 327/77; 326/30

(58) Field of Classification Search .......... 326/30, 326/82; 327/77
See application file for complete search history.

(56) References Cited

U.S. PATENT DOCUMENTS

| | | | |
|---|---|---|---|
| 5,714,852 A | 2/1998 | Enderich | |
| 6,094,075 A * | 7/2000 | Garrett et al. | 327/108 |
| 6,377,197 B1 | 4/2002 | Rantanen | |
| 6,429,679 B1 * | 8/2002 | Kim et al. | 326/30 |
| 6,566,905 B2 | 5/2003 | Sanzo et al. | |
| 6,570,402 B2 * | 5/2003 | Koo et al. | 326/30 |
| 6,612,502 B2 | 9/2003 | Poucher | |
| 6,624,506 B2 | 9/2003 | Sasaki et al. | |
| 6,700,480 B2 | 3/2004 | Moore | |
| 6,717,393 B2 * | 4/2004 | Male | 324/76.17 |
| 6,828,820 B2 * | 12/2004 | Ohno | 326/30 |
| 6,924,758 B1 | 8/2005 | Lorenz | |
| 7,042,363 B2 | 5/2006 | Katrak et al. | |
| 7,345,504 B2 * | 3/2008 | Lin et al. | 326/30 |
| 7,782,078 B2 * | 8/2010 | Koo | 326/30 |
| 7,827,330 B2 | 11/2010 | Richards et al. | |
| 2008/0077718 A1 | 3/2008 | Kn et al. | |
| 2008/0100334 A1 * | 5/2008 | Kim et al. | 326/30 |

OTHER PUBLICATIONS

"NM24C03/C05/C09/C17 2K-/4K-/8K-/16K-Bit Serial EEPROM with Write Protect (I2C Synchronous 2-Wire Bus)", National Semiconductor, Jan. 1993, pp. 1-12 (see esp. pp. 5-6).
"PCA9691 8-bit A/D and D/A converter", Product data sheet, NXP founded by Philips, Rev. 01—Apr. 8, 2008, pp. 1-28 (see esp. pp. 1 and 4).
"Resistor-Programmable Temperature Switch and Analog Temperature Sensor", National Semiconductor Corporation, Feb. 9, 2010, 20 pages.
Wai Cheong, et al. "Technique for Assigning a Parameter Value to a Device Using a Resistance on a Single Device Pin", U.S. Appl. No. 12/590,875, filed Nov. 16, 2009.

* cited by examiner

*Primary Examiner* — Ryan Jager
(74) *Attorney, Agent, or Firm* — Wade J. Brady, III; Frederick J. Telecky, Jr.

(57) ABSTRACT

A resistor-programmable device generates pulses counted by a counter. The counter's output controls a drive signal generator, such as an adjustable current source. The drive signal generator generates a drive signal (such as a current), which leads to the creation of a sense signal (such as a voltage) using a resistance. The resistance can have one of a set of specified values or fall within one of a set of specified windows. The resistor-programmable device can convert the resistance value into a digital value, which can be used to set a sensor trip point threshold or some other parameter. The digital or parameter value is independent of changes in the resistance that are within a specified tolerance. For instance, the same parameter value could be selected even when the resistance varies within some tolerance (such as 1%) as the resistor-programmable device can determine the window in which the resistance falls.

20 Claims, 4 Drawing Sheets

RESISTOR-PROGRAMMABLE DEVICE AT LOW VOLTAGE

TECHNICAL FIELD

This disclosure is generally directed to resistor-programmable devices. More specifically, this disclosure relates to a resistor-programmable device at low voltage.

BACKGROUND

It is common for a system to have an integrated circuit that uses one or more external resistors to set a threshold, trip point, or other parameter for the system. This provides users with a great deal of flexibility when using the same integrated circuit. For example, each user could set the trip point of a temperature sensor by selecting the appropriate value(s) for the external resistor(s). The alternative would be to manufacture hundreds of different integrated circuits for hundreds of different trip points, which is not practical.

There are two common ways of setting a parameter value based on an external resistor. One method uses an external voltage source and a resistive divider. By choosing the appropriate resistor values, one can establish any desired threshold voltage. The other method has the integrated circuit using a current source to provide a fixed current that drives an external resistor. By choosing an appropriate resistor value, the user can establish any desired threshold voltage.

A disadvantage of these two approaches is that the external resistor(s) and the voltage or current source introduce tolerances on the threshold or other parameter. In other words, variations in these components can cause variations in the threshold or other parameter output by the integrated circuit.

BRIEF DESCRIPTION OF THE DRAWINGS

For a more complete understanding of this disclosure and its features, reference is now made to the following description, taken in conjunction with the accompanying drawings, in which.

DETAILED DESCRIPTION

FIGS. 1 through 4, discussed below, and the various embodiments used to describe the principles of the present invention in this patent document are by way of illustration only and should not be construed in any way to limit the scope of the invention. Those skilled in the art will understand that the principles of the invention may be implemented in any type of suitably arranged device or system.

Figure 1:
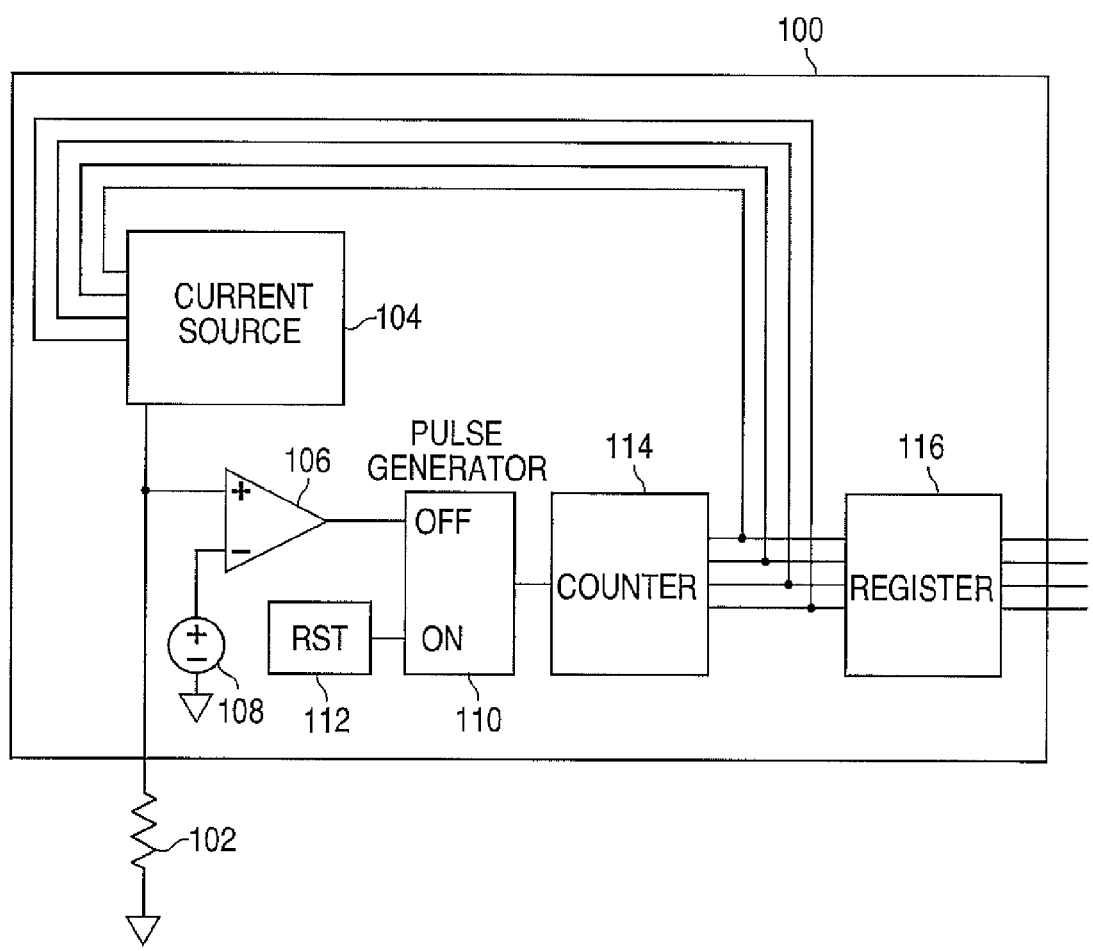
FIG. 1 illustrates a first example resistor-programmable device according to this disclosure.

FIG. 1 illustrates a first example resistor-programmable device 100 according to this disclosure. As shown in FIG. 1, the resistor-programmable device 100 includes, is coupled to, or is otherwise associated with a resistor 102. The resistor 102 represents any suitable resistive structure(s) having any suitable resistance.

In order to program the device 100, the resistor 102 has a resistance equal to one of multiple values or a resistance that falls within one of multiple windows. For example, the resistor 102 could have one of sixteen nominal resistance values, or the resistor 102 could have a resistance that falls within one of sixteen resistance ranges. At least one parameter or other value associated with the device 100 is set based on the resistance of the resistor 102. For instance, the device 100 could use the resistance of the resistor 102 to set a trip point for a temperature sensor or other sensor. Note, however, that the device 100 could be used to set any other suitable parameter(s) or other value(s) for itself or for another device or system.

In this example, the device 100 includes a controllable current source 104. The controllable current source 104 includes one or more current sources that can provide a variable amount of current to the resistor 102. For example, the controllable current source 104 could be arranged to provide binary-weighted currents to the resistor 102. The binary-weighted currents could generally be expressed as I, 2I, 4I, 8I, and so on. Note, however, that other currents could be provided by the controllable current source 104, such as currents expressed as I, 2I, 3I, 4I, and so on. The controllable current source 104 includes any suitable structure(s) for generating a controllable amount of current.

The current through the resistor 102 generates a voltage, which is provided to the non-inverting terminal of a comparator 106. The inverting terminal of the comparator 106 is coupled to a voltage source 108, which provides a threshold voltage to the comparator 106. The comparator 106 generates an output based on its input voltages. For example, the comparator 106 could output a low logic level signal when the input at its non-inverting terminal is less than the input at its inverting terminal. The comparator 106 could also output a high logic level signal when the input at its non-inverting terminal is greater than the input at its inverting terminal. The comparator 106 includes any suitable structure for comparing input signals. The voltage source 108 includes any suitable structure providing a threshold voltage, such as a 100 mV, 200 mV, or 400 mV source.

The output of the comparator 106 is coupled to an "off" input of a pulse generator 110. A reset unit 112 is coupled to an "on" input of the pulse generator 110. The pulse generator 110 generates a pulse signal containing pulses, and the pulse signal is provided to an input of a counter 114. An output of the counter 114 is coupled to the controllable current source 104 and to a register 116. The pulse generator 110 includes any suitable structure for outputting pulses, such as an oscillator or other clock. The reset unit 112 includes any suitable structure for resetting one or more components upon a reset event, like a power-on event. The counter 114 includes any suitable structure for counting upwards or downwards, such as a four-bit or eight-bit counter. The register 116 includes any suitable structure for storing one or more values output by the counter 114, such as a four-bit or eight-bit register.

In response to a power-on reset or other event, the reset unit 112 outputs a signal (such as a high pulse) that turns on the pulse generator 110. This causes the pulse generator 110 to begin outputting pulses in the pulse signal, such as pulses at a specified interval. The pulse signal is provided to the counter 114, which counts the pulses and outputs a value. The value output by the counter 114 controls the controllable current source 104, causing the current source 104 to alter the current flowing through the resistor 102. In some embodiments, the counter 114 is reset in response to the reset or other event, and each pulse causes the counter 114 to increment its value. As a result, the counter 114 outputs a higher value in response to each pulse, and the higher values cause the current source 104 to output higher currents. Eventually, the current through the resistor 102 produces a voltage that exceeds the threshold voltage provided by the voltage source 108, and the comparator 106 turns off the pulse generator 110. The value output by the counter 114 at that point can be stored in the register 116.

In this way, the counter 114 can be used to adjust the controllable current source 104 until the voltage across the resistor 102 exceeds a threshold value. The value of the counter 114 when the threshold value is exceeded can be used to set at least one parameter or other value of the device 100 or another device or system.

Figure 2:
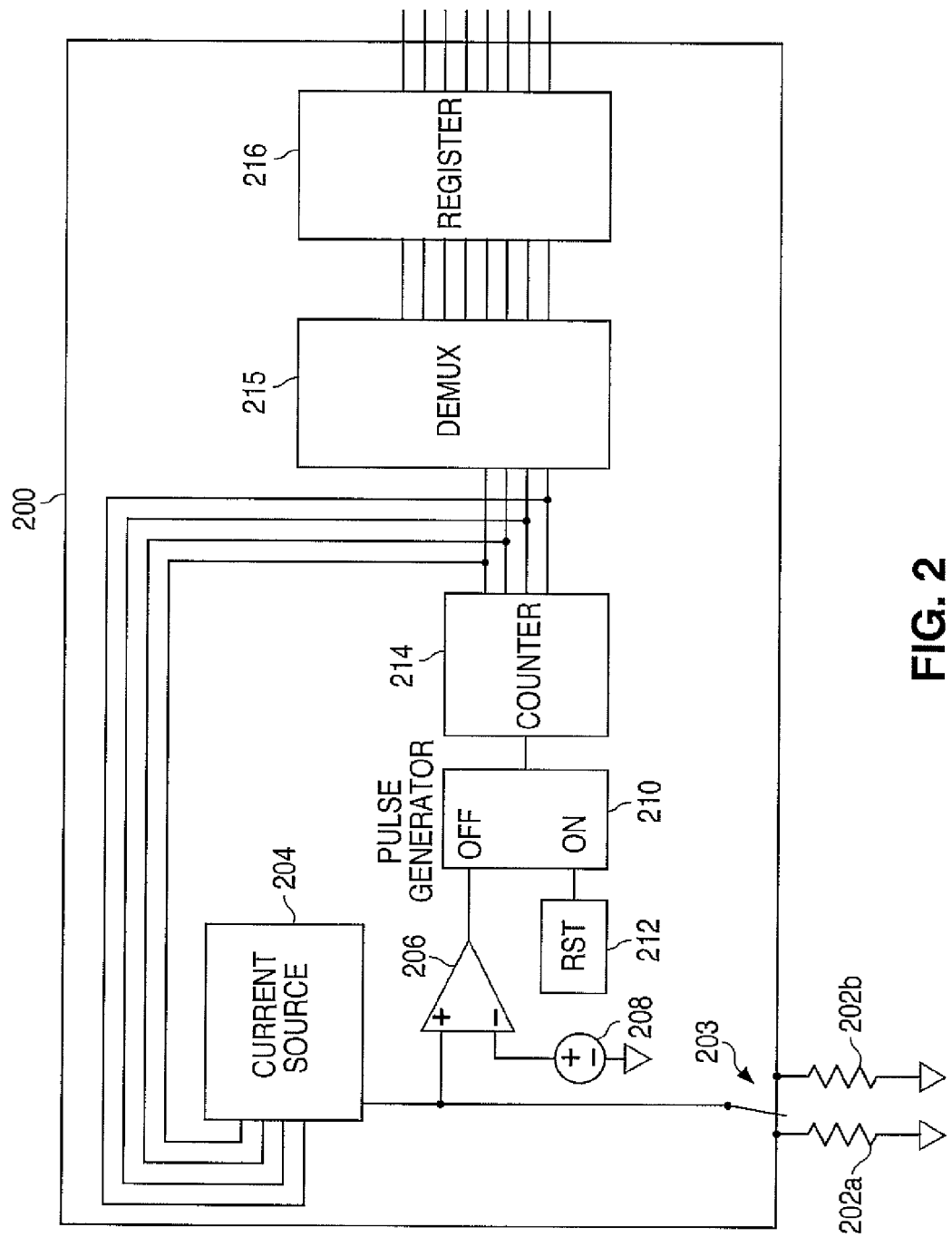
FIG. 2 illustrates a second example resistor-programmable device according to this disclosure.

FIG. 2 illustrates a second example resistor-programmable device 200 according to this disclosure. The device 200 is similar in operation to the device 100 of FIG. 1. However, the device 200 in this example includes, is coupled to, or is otherwise associated with multiple resistors 202a-202b. Each resistor 202a-202b has a resistance equal to one of multiple values or a resistance that falls within one of multiple windows. As a particular example, each resistor 202a-202b could have one of sixteen nominal resistance values, or each resistor 202a-202b could have a resistance that falls within one of sixteen resistance ranges. This would allow up to 256 different combinations of resistances to be coupled to and identified by the device 200. While two resistors are shown here, any number of resistors could be coupled to the device 200.

At least one switch 203 couples the resistors 202a-202b to the device 200. In this example, a single two-position switch is shown, where the switch 203 can couple one of the resistors 202a-202b to the device 200. Of course, multiple switches could be used, such as when each resistor 202a-202b is coupled to the device 200 by its own switch.

The resistor-programmable device 200 includes many of the same components as the resistor-programmable device 100. Namely, the resistor-programmable device 200 includes a controllable current source 204, a comparator 206, a voltage source 208, a pulse generator 210, a reset unit 212, a counter 214, and a register 216. The controllable current source 204 generates current that flows through one of the resistors 202a-202b, generating a voltage that is compared to a threshold value by the comparator 206. The comparator 206 and the reset unit 212 control the operation of the pulse generator 210, and the counter 214 can increment a value based on the pulses received from the pulse generator 210. The pulse generator 210 can be stopped by the comparator 206 when the voltage across one of the resistors 202a-202b exceeds the threshold value, and the value output by the counter 214 could be stored in the register 216.

In this example, to support the use of multiple resistors 202a-202b, a demultiplexer 215 is inserted between the counter 214 and the register 216. When the resistance of the first resistor 202a is being determined, the demultiplexer 215 could couple the outputs of the counter 214 to one set of inputs of the register 216. When the resistance of the second resistor 202b is being determined, the demultiplexer 215 could couple the outputs of the counter 214 to another set of inputs of the register 216. This allows multiple counter values to be stored in the register 216. Note, however, that other approaches could be used. For instance, the demultiplexer 215 could provide different counter values to different registers, or the demultiplexer 215 could be omitted and multiple values could be stored in and then read out of the register 216. The demultiplexer 215 includes any suitable structure for demultiplexing signals.

In this way, the device 200 can determine the resistances of multiple resistors (one at a time) and can store those values in the register 216 for use in setting one or more parameters or other values of the device 200 or another device or system.

Note that the use of a switch 203 and a demultiplexer 215 represents one possible way in which the resistances of multiple resistors could be determined. Other techniques could also be used to sequentially or simultaneously determine the resistances of multiple resistors. For example, the switch 203 and the demultiplexer 215 could be omitted, and some or all of the remaining components 204-216 could be duplicated for each resistor to be measured. In this case, the resistances of multiple resistors could be determined simultaneously. Any other suitable technique could be used to determine the resistances of multiple resistors.

By using the current sources 104, 204 to provide an adjustable current to each resistor being measured, it is possible to reduce the size of the devices 100, 200. For example, if a resistor could have one of N nominal resistance values, one prior approach uses $2^N-1$ comparators to effectively form a flash analog-to-digital converter (ADC). In the devices 100, 200, a single comparator 106, 206 can be used, reducing the size and cost of the devices 100, 200. Moreover, the devices 100, 200 could operate at a lower voltage, such as 1.6V, than some prior approaches. Further, most or all of the components in the device 100, 200 could be substantially or completely turned off after determination of the resistance(s) of the resistor(s). This can reduce power consumption by the device 100, 200.

In addition, the devices 100, 200 can prevent tolerances in the resistors 102 and 202a-202b from affecting the digital value(s) stored in the registers 116 and 216. The external resistance value or values are converted into one or more digital values, so the devices 100, 200 effectively form resistor-to-digital converters. In some applications, the one or more digital values are then converted into an analog signal using a digital-to-analog converter (DAC). As a particular example, in some embodiments, the resistors 102 and 202a-202b could be selected from a restricted list of resistor values, and the maximum tolerance of each resistor could be restricted to a specific value, such as 1%, 2%, or 5%. Here, even though the exact resistance of an external resistor might be uncertain (such as when a resistor could have a resistance of 10 k$\Omega$±100$\Omega$), the devices 100 and 200 help to keep the voltage across that resistor within a specified window. In other words, despite its tolerance, the device 100 or 200 is able to identify the window in which the resistance falls and output a digital value for that resistance. Each digital value may be unaffected by variations within the tolerance of the associated resistor.

Although FIGS. 1 and 2 illustrate examples of resistor-programmable devices 100, 200, various changes may be made to FIGS. 1 and 2. For example, the use of certain numbers of bits or signal lines (such as four or eight bits or signal lines) is for illustration only. Also, FIGS. 1 and 2 illustrate providing current to a resistor and using a voltage across the resistor to determine the resistance of the resistor. Other approaches could also be used, such as providing a programmable voltage to a resistor and determining if and when a current through the resistor exceeds a threshold value. Further, while these figures illustrate storing the counter value(s) in a register and then outputting the stored value(s), the counter value(s) could be further processed or otherwise used before the resulting value or values are output. In addition, the above description has often described the devices 100, 200 as incrementing the counters 114, 214 and determining when the voltage across a resistor 102, 202a, 202b exceeds a threshold. However, other approaches could also be used, such as setting the counter to a maximum value and then decrementing the counter until the voltage across the resistor falls below the threshold. In this document, "changing" a counter's value may include incrementing or decrementing the value, and "violating" or "passing" a threshold may involve increasing a voltage or other signal to exceed the threshold or decreasing the voltage or other signal to fall below the threshold.

Figure 3:
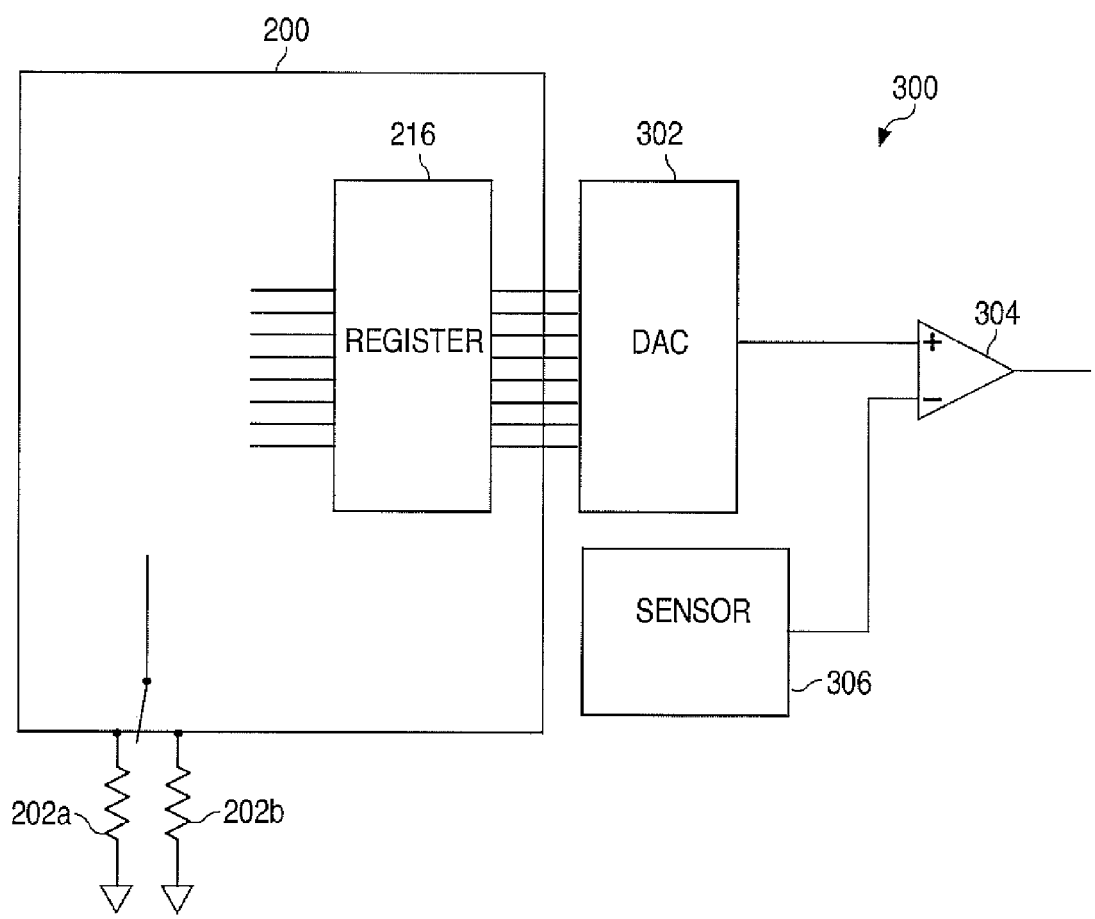
FIG. 3 illustrates an example system using a resistor-programmable device according to this disclosure.

FIG. 3 illustrates an example system 300 using a resistor-programmable device according to this disclosure. As shown in FIG. 3, the system 300 represents a sensing system that includes the resistor-programmable device 200 of FIG. 2. In this example, the register 216 in the device 200 outputs a digital value based on the resistances of the resistors 202a-202b to a digital-to-analog converter (DAC) 302, which converts the digital value into an analog signal. For example, the device 200 could output an eight-bit signal, and the DAC 302 could convert the eight-bit signal into an analog voltage. The DAC 302 includes any suitable structure for converting a digital signal into an analog signal.

The output of the DAC 302 is coupled to the non-inverting terminal of a comparator 304. The inverting terminal of the comparator 304 is coupled to a sensor 306. The comparator 304 includes any suitable structure for comparing input signals. The sensor 306 includes any suitable structure for sensing one or more characteristics and generating an output signal based on the sensed characteristic(s).

The sensor 306 generates an analog signal based on one or more characteristics being monitored. For example, the sensor 306 could represent a temperature sensor, and the sensor 306 could generate an analog output voltage that increases as the temperature increases. The comparator 304 compares the signal output by the sensor 306 to the signal output by the DAC 302 and generates an output based on the comparison. For example, the comparator 304 could output a low logic level signal when the output of the sensor 306 is lower than the output of the DAC 302. The sensing system 300 trips when the output of the sensor 306 becomes greater than the output of the DAC 302, which could cause the comparator 304 to output a high logic level signal. By using the resistor-programmable device 200 of FIG. 2, multiple resistors can be used to set the trip point for the sensor 306. Moreover, the trip point for the sensor 306 is generally invariable even when the resistances of the resistors 202a-202b can vary somewhat due to, for instance, the tolerance of the resistors 202a-202b.

Although FIG. 3 illustrates one example of a system 300 using a resistor-programmable device, various changes may be made to FIG. 3. For example, the system 300 could use the device 100 of FIG. 1 or a device that uses more than two resistors. Also, the output of the counter could be coupled directly to the DAC 302 without requiring use of an intermediate register. In addition, the devices 100, 200 could be used in any suitable system and need not be used to set the trip point for a sensor. As a particular example, the devices 100, 200 could be used to assign an address to a device or system based on multiple resistances.

Figure 4:
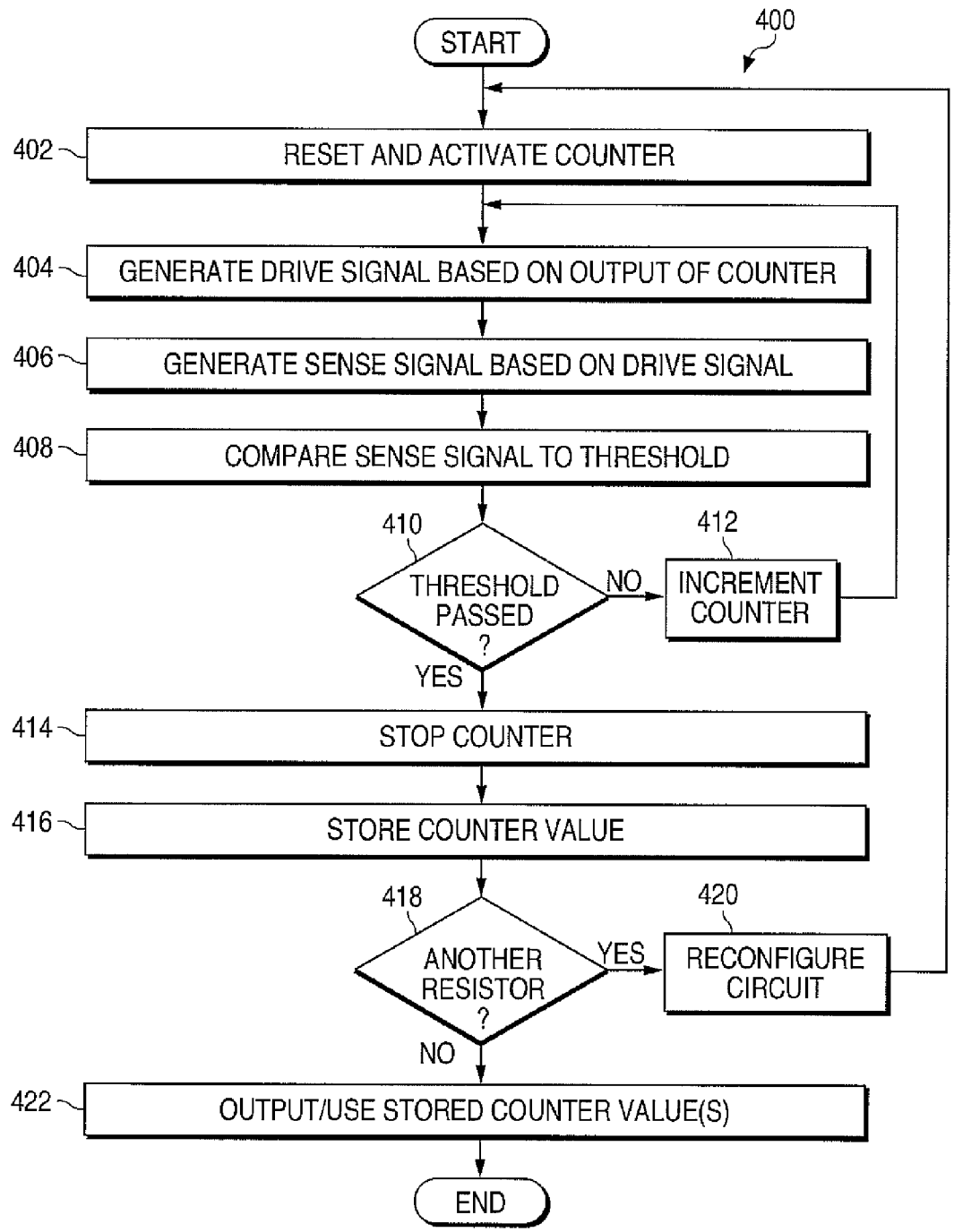
FIG. 4 illustrates an example method for setting a threshold or other value using a resistor-programmable device according to this disclosure.

FIG. 4 illustrates an example method 400 for setting a threshold or other value using a resistor-programmable device according to this disclosure. For ease of explanation, the method 400 is described with respect to the device 100 of FIG. 1. The method 400 could be used by any other suitable device or system, such as the device 200 of FIG. 2.

A counter is reset and activated at step 402. This could include, for example, the reset unit 112 resetting and activating the counter 114 in response to a power-on event or other triggering event. A drive signal is generated based on the output of the counter at step 404. This could include, for example, the controllable current source 104 generating a current based on the value being output from the counter 114. A sense signal is generated at step 406. This could include, for example, the current from the controllable current source 104 generating a voltage across the resistor 102.

The sense signal is compared to a threshold value at step 408. This could include, for example, the comparator 106 comparing the voltage across the resistor 102 to a reference voltage from the voltage source 108. A determination is made whether the threshold has been passed at step 410. This could include, for example, the comparator 106 outputting a signal indicating whether the voltage across the resistor 102 exceeds the reference voltage from the voltage source 108. If not, the counter is incremented at step 412. This could include, for example, the pulse generator 110 generating a pulse that causes the counter 114 to increment its value. The method 400 then returns to step 404 to generate another drive signal based on the updated counter value.

If the threshold is passed at step 410, the counter is stopped at step 414. This could include, for example, the output of the comparator 106 stopping the pulse generator 110, so the counter 114 stops receiving pulses. The counter value is stored at step 416. This could include, for example, storing the counter value in the register 116. A determination is made whether any other resistors are to be measured at step 418. If so, the circuit is reconfigured at step 420, and the method 400 returns to step 402 to repeat the process for the next resistor. The reconfiguration of the circuit could include, for example, changing settings for any switches, demultiplexers, or other components.

If no more resistors remain to be measured at step 418, the one or more stored counter values are output or otherwise used at step 422. This could include, for example, the register 116 providing the stored counter value(s) to a DAC or other component for use in generating an analog trip point for a sensor. The register 116 could provide the stored counter value(s) to any other suitable component(s) for use in any suitable manner(s).

Although FIG. 4 illustrates one example of a method 400 for setting a threshold or other value using a resistor-programmable device, various changes may be made to FIG. 4. For example, while shown as a series of steps, various steps in FIG. 4 may overlap, occur in parallel, occur in a different order, or occur multiple times. Also, while shown as incrementing the counter value, other approaches could also be used as noted above, such as setting the counter value to a maximum value and then decrementing the counter until the voltage across the resistor falls below the threshold.

It may be advantageous to set forth definitions of certain words and phrases that have been used within this patent document. The term "couple" and its derivatives refer to any direct or indirect communication between two or more components, whether or not those components are in physical contact with one another. The terms "include" and "comprise," as well as derivatives thereof, mean inclusion without limitation. The term "or" is inclusive, meaning and/or. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this invention. Other changes, substitutions, and alterations are also possible without departing from the spirit and scope of this invention as defined by the following claims.

What is claimed is:

1. A method comprising:
   providing a drive signal to a specified one of multiple resistances via at least one switch, the drive signal based on a counter value that is output by a counter;
   generating a sense signal based on the drive signal using the specified resistance;
   determining if the sense signal passes a threshold;
   if the sense signal does not pass the threshold, changing the counter value that is output by the counter and repeating the providing, generating, and determining steps; and
   if the sense signal does pass the threshold, providing the counter value to a demultiplexer for storage in at least one register.

2. The method of claim 1, further comprising:
   repeating the providing, generating, determining, and changing steps to identify a second counter value associated with a second specified one of the multiple resistances.

3. The method of claim 2, further comprising:
   providing the second counter value to the demultiplexer for storage in the at least one register.

4. The method of claim 2, wherein the at least one register comprises a single multi-bit register.

5. The method of claim 1, further comprising:
   identifying at least one parameter value of a resistor-programmable device based on the counter value;
   wherein the at least one parameter value is independent of changes in the specified resistance that are within a specified tolerance.

6. The method of claim 1, wherein:
   generating the drive signal comprises generating an adjustable current;
   generating the sense signal comprises generating a voltage across the specified resistance; and
   changing the counter value that is output by the counter comprises incrementing the counter value.

7. A method comprising:
   providing a drive signal based on a counter value that is output by a counter;
   generating a sense signal based on the drive signal using a resistance;
   determining if the sense signal passes a threshold;
   if the sense signal does not pass the threshold, changing the counter value that is output by the counter and repeating the providing, generating, and determining steps;
   if the sense signal does pass the threshold, generating a trip point threshold based on the counter value; and
   comparing an output signal from a sensor to the trip point threshold in order to determine whether the output signal is less than or greater than the trip point threshold.

8. An apparatus comprising:
   a pulse generator configured to generate pulses in a pulse signal;
   a counter configured to receive the pulse signal and to output a counter value that varies based on a number of received pulses;
   a drive signal generator configured to generate a drive signal based on the counter value in order to generate a sense signal using a resistance, the sense signal based on the drive signal;
   a comparator configured to determine if the sense signal passes a threshold, wherein the pulse generator is configured to generate the pulses in the pulse signal until the comparator outputs a signal indicating that the threshold is passed; and
   a digital-to-analog converter configured to generate a trip point threshold for a sensor based on the counter value that is output by the counter when the comparator outputs the signal indicating that the threshold is passed.

9. The apparatus of claim 8, further comprising:
   a register configured to store the counter value that is output by the counter when the comparator outputs the signal indicating that the threshold is passed;
   wherein the digital-to-analog converter is configured to generate the trip point threshold for the sensor based on the counter value stored in the register.

10. The apparatus of claim 8, further comprising:
    a reset unit configured to turn the pulse generator on in response to a triggering event.

11. The apparatus of claim 8, wherein:
    the drive signal generator comprises at least one adjustable current source; and
    the apparatus further comprises a voltage source configured to provide a voltage as the threshold to the comparator.

12. The apparatus of claim 8, wherein the counter is configured to increment the counter value in response to each pulse in the pulse signal.

13. The apparatus of claim 8, wherein:
    the apparatus is configured to output a digital value based on multiple resistances;
    each of the multiple resistances has a resistance that (i) equals one of multiple specified values or (ii) falls within one of multiple specified windows; and
    the digital value is based on the specified value or specified window associated with each of the resistances.

14. An apparatus comprising:
    a pulse generator configured to generate pulses in a pulse signal;
    a counter configured to receive the pulse signal and to output a counter value that varies based on a number of received pulses;
    a drive signal generator configured to generate a drive signal based on the counter value in order to generate a sense signal, the sense signal based on the drive signal;
    a comparator configured to determine if the sense signal passes a threshold, wherein the pulse generator is configured to generate the pulses in the pulse signal until the comparator outputs a signal indicating that the threshold is passed;
    a register configured to store the counter value that is output by the counter when the comparator outputs the signal indicating that the threshold is passed;
    at least one switch configured to couple one of multiple resistances to the drive signal generator; and
    a demultiplexer coupled between the counter and the register.

15. A system comprising:
    a resistor-programmable device configured to output a digital value associated with a trip point of a sensor;
    a digital-to-analog converter configured to convert the digital value into an analog trip point threshold; and
    a first comparator configured to compare an output signal from the sensor to the analog trip point threshold;
    wherein the resistor-programmable device comprises:
      a pulse generator configured to generate pulses in a pulse signal;
      a counter configured to receive the pulse signal and to output a counter value that varies based on a number of received pulses;
      a drive signal generator configured to generate a drive signal based on the counter value in order to generate a sense signal using a resistance, the sense signal based on the drive signal; and a second comparator configured to determine if the sense signal passes a threshold;

wherein the pulse generator is configured to generate the pulses in the pulse signal until the second comparator outputs a signal indicating that the threshold is passed, the digital value based on the counter value that is output by the counter when the comparator outputs the signal indicating that the threshold is passed.

16. The system of claim 15, wherein the resistor-programmable device further comprises:

a register configured to store the counter value that is output by the counter when the second comparator outputs the signal indicating that the threshold is passed;

wherein the digital-to-analog converter is configured to generate the analog trip point threshold for the sensor based on the counter value stored in the register.

17. The system of claim 16, wherein:

the system further comprises at least one switch configured to couple one of multiple resistances to the drive signal generator; and the resistor-programmable device further comprises a demultiplexer coupled between the counter and the register.

18. The apparatus of claim 15, wherein the resistor-programmable device further comprises:

a reset unit configured to turn the pulse generator on in response to a triggering event.

19. The system of claim 15, wherein:

the drive signal generator comprises at least one adjustable current source; and the resistor-programmable device further comprises a voltage source configured to provide a voltage as the threshold to the second comparator.

20. The system of claim 15, wherein:

the resistor-programmable device is configured to output the digital value based on multiple resistances;

each of the multiple resistances has a resistance that (i) equals one of multiple specified values or (ii) falls within one of multiple specified windows; and the digital value is based on the specified value or specified window associated with each of the resistances.

* * * * *